United States Patent
Parkhurst (10) Patent No.: US 10,038,415 B2
(45) Date of Patent: Jul. 31, 2018

(54) POWER AMPLIFIER MATCHING CIRCUIT WITH DVCS

(71) Applicant: CAVENDISH KINETICS, INC., San Jose, CA (US)

(72) Inventor: Ray Parkhurst, Santa Clara, CA (US)

(73) Assignee: CAVENDISH KINETICS, INC., San Jose, CA (US)

(*) Notice: Subject to any disclaimer, the term of this patent is extended or adjusted under 35 U.S.C. 154(b) by 0 days.

(21) Appl. No.: 15/516,995

(22) PCT Filed: Sep. 23, 2015

(86) PCT No.: PCT/US2015/051625
§ 371 (c)(1),
(2) Date: Apr. 5, 2017

(87) PCT Pub. No.: WO2016/057218
PCT Pub. Date: Apr. 14, 2016

(65) Prior Publication Data
US 2017/0250660 A1    Aug. 31, 2017

Related U.S. Application Data

(60) Provisional application No. 62/061,928, filed on Oct. 9, 2014.

(51) Int. Cl.
*H03F 3/191* (2006.01)
*H03F 1/56* (2006.01)
(Continued)

(52) U.S. Cl.
CPC ............ *H03F 1/56* (2013.01); *H03F 3/195* (2013.01); *H03F 3/213* (2013.01);
(Continued)

(58) Field of Classification Search
CPC ........... H03F 3/191; H03F 3/193; H03F 1/565
(Continued)

(56) References Cited

U.S. PATENT DOCUMENTS

| | | | |
|---|---|---|---|
| 5,909,147 A | * | 6/1999 | Wyatt ...................... H03F 1/22 330/306 |
| 2009/0174496 A1 | | 7/2009 | Van Bezooijen |
| 2013/0187712 A1 | | 7/2013 | Cabanillas et al. |

FOREIGN PATENT DOCUMENTS

| WO | 2009/060264 A1 | 5/2009 |
|---|---|---|
| WO | 2013/108677 A1 | 7/2013 |

OTHER PUBLICATIONS

Search report and written opinion for PCT/US2015/051625 dated Oct. 26, 2015.
(Continued)

*Primary Examiner* — Steven J Mottola
(74) *Attorney, Agent, or Firm* — Patterson & Sheridan, LLP; Steven Versteeg (57) ABSTRACT

Embodiments disclosed herein generally relate to power amplifier matching circuits used for matching impedance and harmonic control in a device, such as a cellular phone. In one example, a power amplifier matching circuit includes two DVCs, four inductors, a transistor, and a capacitor. Utilizing the two DVCs, the impedance matching ratio and the center frequency of the circuit are capable of adjustment as needed. Moreover, the inclusion of the two DVCs may also prevent harmonic frequencies from undesirably passing through the power amplifier matching circuit to the antenna of a cellular device. The power amplifier matching circuit may be used in conjunction with an amplifier, where the output of the amplifier is proportional to the current in the circuit.

20 Claims, 6 Drawing Sheets (51) Int. Cl.
*H03F 3/195* (2006.01)
*H03F 3/213* (2006.01)

(52) U.S. Cl.
CPC .. *H03F 2200/102* (2013.01); *H03F 2200/387* (2013.01); *H03F 2200/451* (2013.01)

(58) Field of Classification Search
USPC .......................................... 330/302, 305, 306
See application file for complete search history.

(56) References Cited

OTHER PUBLICATIONS

European Patent Office; Examination Report for Application No. 15 774 834.4-1203; dated Mar. 12, 2018; 5 total pages.

\* cited by examiner

POWER AMPLIFIER MATCHING CIRCUIT WITH DVCS

CROSS-REFERENCE TO RELATED APPLICATIONS

This application claims benefit of U.S. Provisional Patent Application Ser. No. 62/061,928, filed Oct. 9, 2014, which is herein incorporated by reference.

BACKGROUND OF THE INVENTION

Field of the Invention

Embodiments disclosed herein generally relate to power amplifier matching circuits used for matching impedance and harmonic control in a device, such as a cellular phone.

Description of the Related Art

Cellular phones, such as mobile phones, have many desirable features that make everyday life easier. For instance, mobile phones can receive emails, text messages and other data for the end user to utilize. Additionally, the mobile phone can send emails, text messages and other data from the mobile phone. The mobile phone typically operates on a wireless network provided by any one of the various cell phone carriers. The data sent to and from the mobile phones require the mobile phone to operate at an increasing number of frequencies to support all of the components and antennas of the mobile phone.

Power amplifier output matching circuits may be used to change the nominal 50 ohm load impedance presented by the antenna to a lower impedance appropriate for operation of the power amplifier output stage. These output matching circuits operate over a fixed frequency band and the impedance the circuits present to the power amplifier is optimized for the operation type of the amplifier, such as high linearity or high efficiency.

Figure 1:
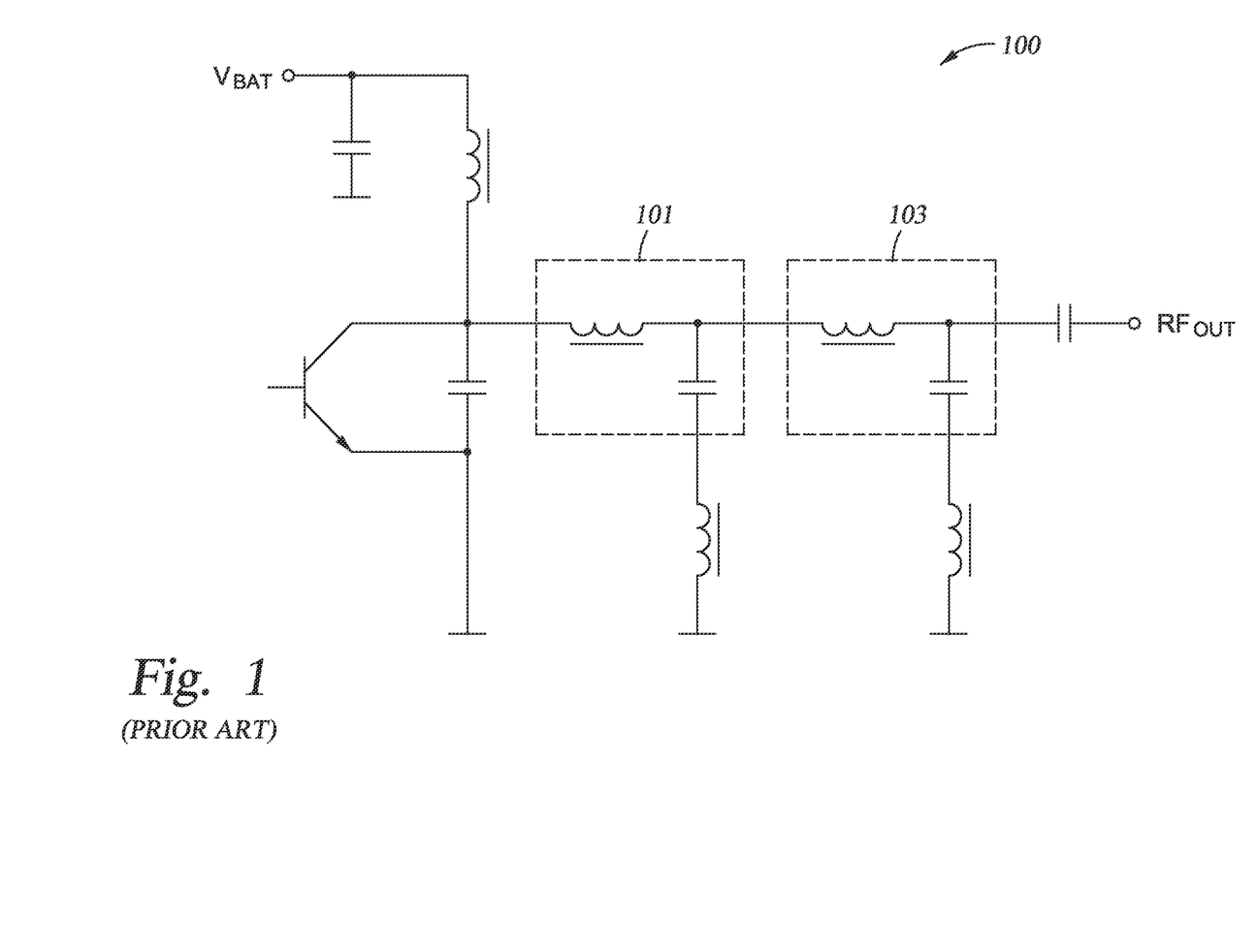
FIG. 1 is a schematic circuit diagram of a power amplifier matching circuit with SMT capacitors and inductors.

FIG. 1 shows a schematic circuit diagram of a typical power amplifier output matching circuit 100. The circuit 100 has at least three inductors integrated into the power amplifier module substrate along with surface mount technology (SMT) capacitors to achieve the required impedance matching for efficient and linear operation of the power amplifier output stage. The circuit 100 works as an impedance matching network using a first section low pass network 101 and a second section low pass network 103. A typical desired load impedance for the power amplifier output stage is about 3 ohms. The first section low pass network 101 increases the load impedance by about 500% by ratio, typically increasing the impedance from about 3 ohms to about 15 ohms. The second section low pass network 103 further increases the impedance from about 15 ohms to about 50 ohms, which is the typical nominal system impedance in which the power amplifier must operate.

The circuit 100 has several drawbacks. One major drawback is the fixed impedance ratio and fixed center frequency, as the substrate inductors and SMT capacitors have fixed values. The circuit 100 is also limited in both bandwidth and insertion loss characteristics, as these parameters are traded-off in design optimization. The circuit 100 is also large in physical size due to the need for SMT capacitors taking up space on the substrate surface. Additionally, the circuit 100 may need to include a fixed matching network between the power amplifier and any duplexers required for frequency division duplex (FDD) system operation. This network matches the duplexer impedance to the load impedance of the power amplifier. One drawback of this method is that the fixed network cannot optimally match the power amplifier and duplexer over a wide bandwidth for typical duplexers with a wide range of impedance values versus frequency. The fixed network additionally cannot optimally match the power amplifier versus varying supply voltages applied to the power amplifier for system efficiency optimization. The fixed network is experimentally determined for each power amplifier/duplexer combination, making bring-up of new phone platforms a slow and tedious process. The network also requires several SMT inductors and/or capacitors, and takes up significant phone board space for each duplexer.

Therefore, there is a need for an improved power amplifier matching circuit functioning as an impedance matching network that allows the impedance to be dynamically adjusted to compensate for variations in system parameters such as transmit center frequency, supply voltage, and duplexer load impedance versus frequency.

SUMMARY OF THE INVENTION

Embodiments disclosed herein generally relate to power amplifier matching circuits used for matching impedance and harmonic control in a device, such as a cellular phone. In one example, a power amplifier matching circuit includes two DVCs, four inductors, a transistor, and a capacitor. Utilizing the two DVCs, the impedance matching ratio and the center frequency of the circuit are capable of adjustment as needed. Moreover, the inclusion of the two DVCs may also prevent harmonic frequencies from undesirably passing through the power amplifier matching circuit to the antenna of a cellular device. The power amplifier matching circuit may be used in conjunction with an amplifier, where the output power of the amplifier is proportional to the current in the circuit.

In one embodiment, a first end of a first inductor is electrically coupled with a power source. A first end of a first capacitor is connected with a second end of the first inductor. A transistor is then connected with a second end of the first capacitor and the second end of the first inductor. A first end of a second inductor is connected with the second end of the first inductor. A first end of a first DVC is connected with the second end of the second inductor. A first end of a second DVC is also connected with the second end of the second inductor. A first end of a third inductor is connected with a second end of the second DVC. A second end of the third inductor is electrically grounded. A second end of the first DVC is connected with a first end of a fourth inductor. A second end of the fourth inductor is electrically grounded. The second end of the first DVC and the first end of the fourth inductor are connected with the RF output.

In another embodiment, a first end of a first inductor is electrically coupled with a power source. A first end of a first capacitor is connected with a second end of the first inductor. A transistor is connected with a second end of the first capacitor and the second end of the first inductor. A first end of an amplifier is connected with the first end and the second end of the first inductor, and a second end of the amplifier is connected with a voltage output. An output of the amplifier is proportional to a current flowing from the first end of the first inductor to the second end of the first inductor.

In another embodiment, a first end of a first inductor is electrically coupled with a power source. A first end of a first capacitor is connected with a second end of the first inductor. A transistor is connected with a second end of the first capacitor and the second end of the first inductor. A first end of a second inductor is connected with the second end of the first inductor. A first end of a first DVC is connected with a second end of the second inductor. A first end of a third inductor is connected with a second end of the first DVC. A second end of the third inductor is electrically grounded. A first end of a fourth inductor is connected with the second end of the second inductor. A first end of a second DVC is connected with a second end of the fourth inductor. A first end of a fifth inductor is connected with a second end of the second DVC. A second end of the fifth inductor is electrically grounded. A first end of a second capacitor is connected with a second end of the fourth inductor. A second end of the second capacitor is connected with the RF output.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to power amplifier matching circuits used for matching impedance and harmonic control in a device, such as a cellular phone. In one example, a power amplifier matching circuit includes two DVCs, four inductors, a transistor, and a capacitor. Utilizing the two DVCs, the impedance matching ratio and the center frequency of the circuit are capable of adjustment as needed. Moreover, the inclusion of the two DVCs may also prevent harmonic frequencies from undesirably passing through the power amplifier matching circuit to the antenna of a cellular device. The power amplifier matching circuit may be used in conjunction with an amplifier, where the output of the amplifier is proportional to the current in the circuit.

Figure 2:
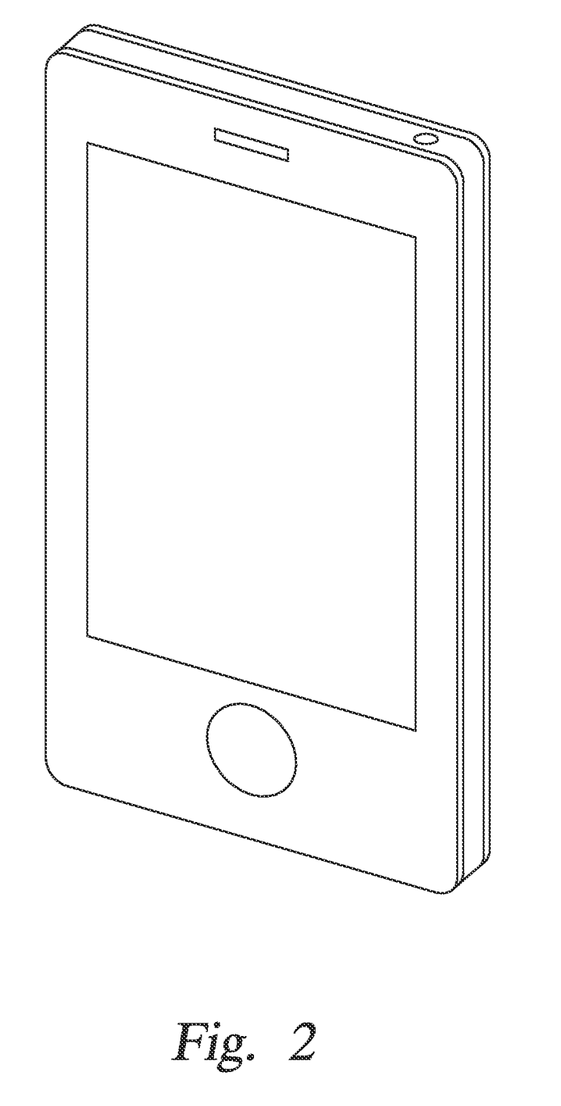
FIG. 2 is an isometric illustration of a mobile phone according to one embodiment.
Figure 3A:
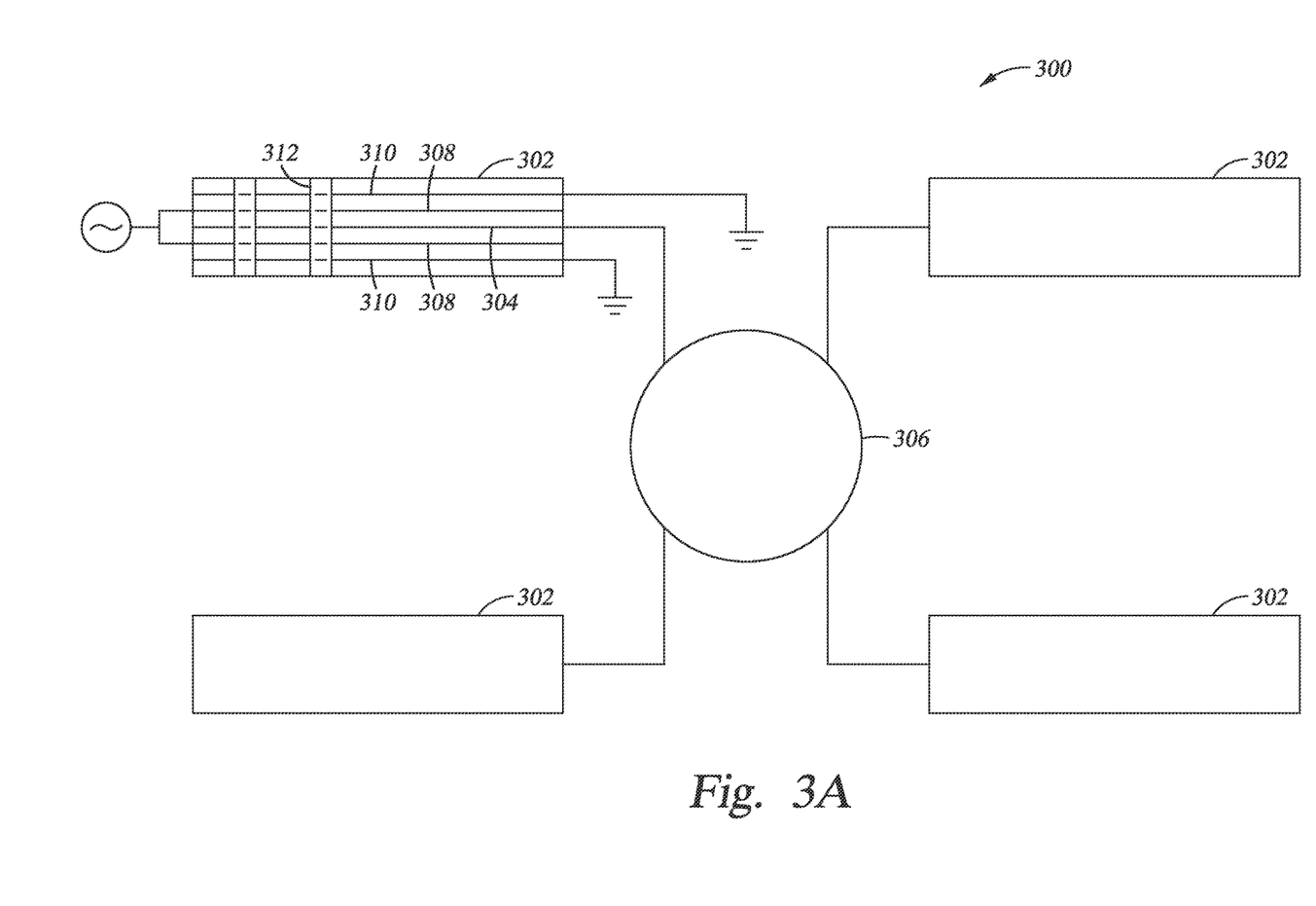
FIG. 3A is a schematic top illustration of a digital variable capacitor according to one embodiment.

FIG. 2 illustrates a mobile phone in which the power amplifier matching circuits discussed herein may be used. FIG. 3A is a schematic illustration of a digital variable capacitor (DVC) 300 according to one embodiment. The DVC 300 includes a plurality of cavities 302. While only one cavity 302 is shown in detail, it is to be understood that each cavity 302 may have a similar configuration, although the capacitance for each cavity 302 may be different.

Each cavity 302 has a RF electrode 304 which is coupled to an RF connector/solder bump 306. Additionally, each cavity 302 has one or more pull-in electrodes 308 and one or more ground electrodes 310. The switching elements 312 (2 shown) are disposed over the electrodes 304, 308, 310. In fact, the switching elements 312 are electrically coupled to the ground electrodes 310. The switching elements 312 are movable to various spacing from the RF electrode 304 due to electrical current applied to the pull-in electrodes 308.

Figure 3B:
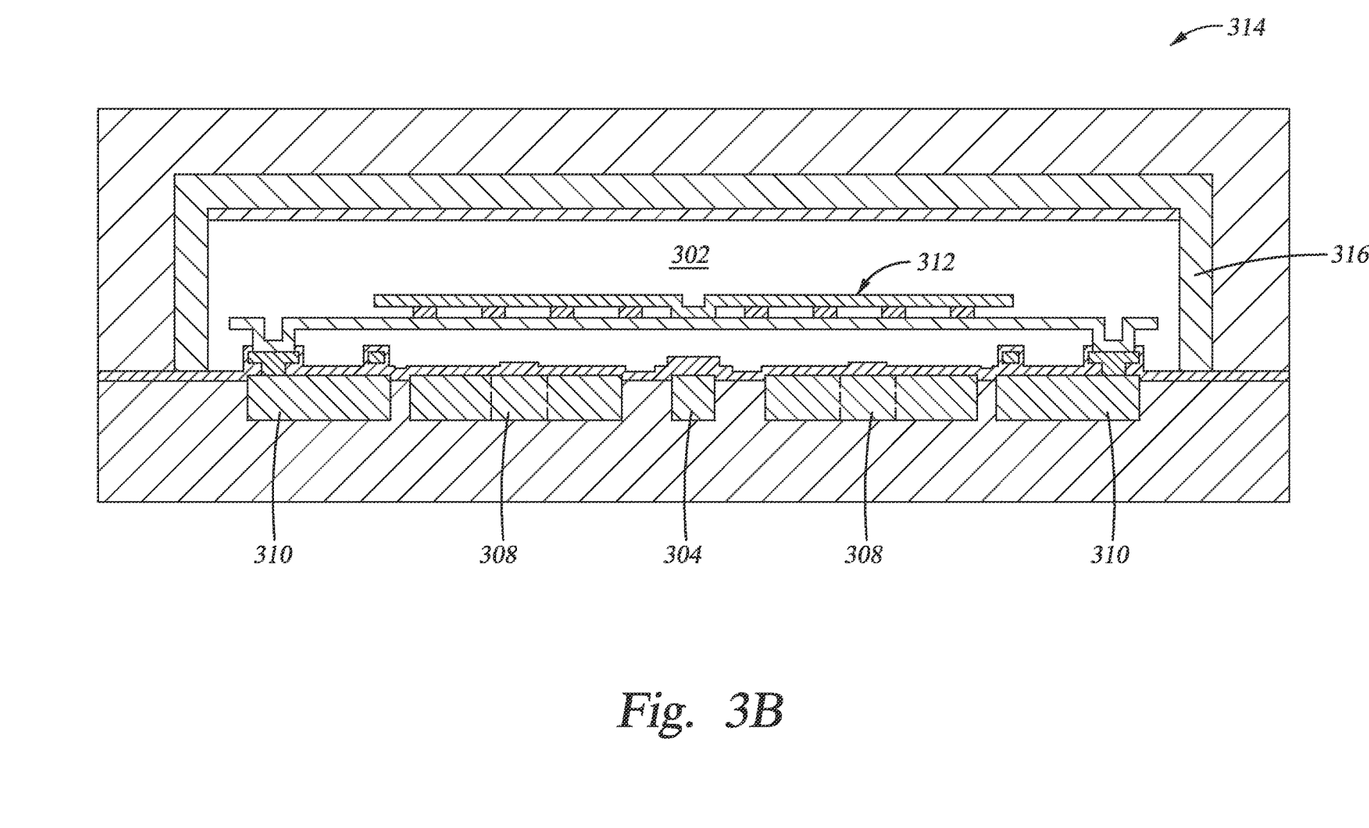
FIG. 3B is a schematic cross-sectional illustration of a MEMS device.

FIG. 3B is a schematic illustration of a MEMS device 314. The MEMS device 314 includes the electrodes 304, 308, 310 and the switching element 312 which is disposed in the cavity 302 and movable from a position close to the RF electrode 304 (referred to as the $C_{max}$ position) and a position spaced adjacent a pull-up electrode 316 (referred to as the $C_{min}$ position). The position of the switching elements 312 within the cavity 302 determines the capacitance for a particular cavity. By using the MEMS devices in a DVC, the power amplifier matching network can be tuned as discussed herein.

The DVC 300 may be used to tune the power amplifier matching network in the mobile phone. A power amplifier matching network may be used for power efficiency and impedance matching, which optimizes the total efficiency of the mobile phone. Impedance matching may further lead to improved signal-to-noise ratio of the circuit.

Figure 4:
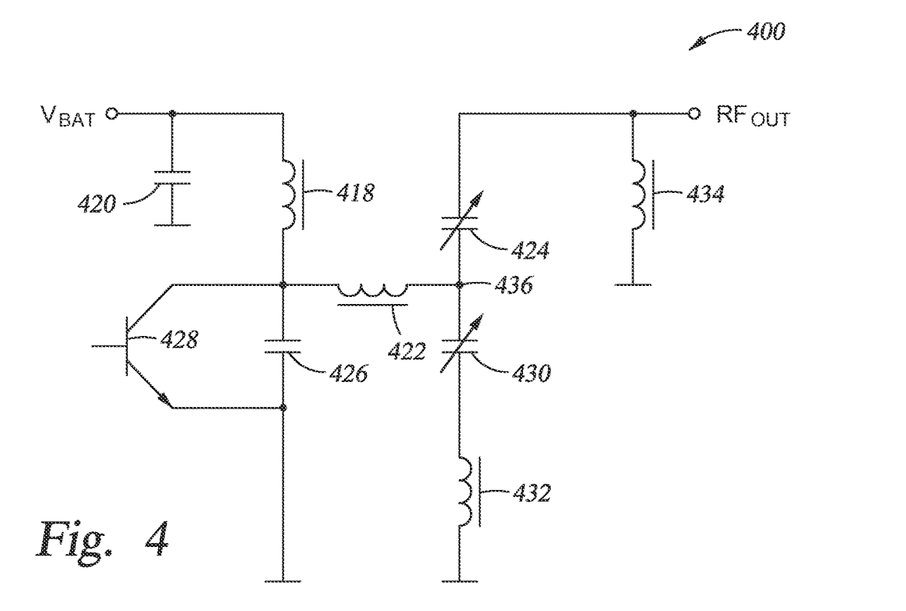
FIG. 4 is a schematic circuit diagram of a power amplifier matching circuit utilizing an impedance matching network.

FIG. 4 shows a first embodiment of a power amplifier matching circuit utilizing DVCs 400, which functions as an impedance matching network (IMN). On one end, the circuit 400, or network, is coupled to the pull-in electrode 308 of the MEMS device 314. Current, or an electric signal, from a power source flows through the circuit starting at the pull-in electrode 308, or Vbat. Vbat is connected with a first end of a first inductor 418. A first end of a first capacitor 426 is connected with a second end of the first inductor 418. A transistor 428 is then connected with a second end of the first capacitor 426 and the second end of the first inductor 418. A first end of a second inductor 422 is connected with the second end of the first inductor 418. A first end of a first DVC 424 is connected with the second end of the second inductor 422. A first end of a second DVC 430 is also connected with the second end of the second inductor 422. The second end of the second inductor 422, the first end of the first DVC 424 and a first end of the second DVC 430 are connected at a node 436. A first end of a third inductor 432 is connected with a second end of the second DVC 430. A second end of the third inductor 432 is electrically grounded. A second end of the first DVC 424 is connected with a first end of a fourth inductor 434. A second end of the fourth inductor 434 is electrically grounded. The second end of the first DVC 424 and the first end of the fourth inductor 434 are connected with a RF output stage, or RF out. A first end of a second capacitor 420 may be connected with the first end of the first inductor 418, where the second end of the second capacitor 420 would be electrically grounded. The RF output line is connected to the RF electrode 304. The electric signal may flow from the RF out to Vbat and is not limited to flowing in a particular direction.

Within the circuit 400, the first inductor 418 may be a DC choke and the third inductor 432 may be interconnect parasitic. The first DVC 424, the second DVC 430 and the fourth inductor 434 may function as a capacitor transformer, where the capacitor transformer has a narrow bandwidth. The first DVC 424 and the second DVC 430 may be integrated onto an existing CMOS/SOI/SOS controller. This eliminates some SMT components required in other power amplifier matching circuits, such as circuit 100, and the overall size of the circuit can be reduced, as fewer parts are needed for the circuit to function properly. The second DVC 430 and the third inductor 432 of the impedance matching network create a series resonant such that any second harmonic gets reflected to the ground, effectively forming a second harmonic trap. This trap is able to be adjusted to track the center frequency by changing the resonant frequency of the second DVC 430 and third inductor 432 series resonator. Additionally, the second capacitor 426, the first inductor 418 and the second inductor 422 create a parallel resonant around the second harmonic.

Another advantage of this circuit 400 is the adjustable capacitance of the first and second DVCs 424, 430. The ratio between the first DVC 424 and the second DVC 430 sets the impedance transformation ratio, or impedance matching ratio, of the circuit 400. For example, setting the second DVC 430 to a larger value than the first DVC 424 results in the impedance transformation ratio increasing, as the impedance is lower where the second inductor line is connected 436. If the second DVC 430 has a smaller value than the first DVC 424, the impedance transformation ratio decreases. Further, if the second DVC 430 is set to zero and the first DVC 424 is infinite, no transformation takes place, as the electric signal flows straight through to the RF output line. Conversely, if the second DVC 430 is infinite and the first DVC 424 is set to zero, no transformation takes place, as the signal gets shorted to the ground and no signal exits. Because the capacitances of both the first DVC 424 and the second DVC 430 are adjustable, the effective series capacitance of the first DVC 424 and the second DVC 430 and the center frequency of the circuit are also adjustable.

The effective series capacitance of the first DVC 424 and the second DVC 430 in parallel with the fourth inductor 434 sets the center frequency of the impedance matching circuit 400. This relationship allows for the resonant frequency of circuit 400 to be tuned for optimal use. To vary the impedance matching ratio, the effective capacitance remains constant looking in from the RF output, which in turn keeps the center frequency fixed while the ratio is varied. To keep the effective value of the first DVC 424 in series with the second DVC 430 constant, the first DVC 424 and the second DVC 430 can be treated as one DVC when looking in from the RF output. As long as the effective capacitance of the first and second DVCs 424, 430 remains unchanged, the individual capacitance of either the first DVC 424 or the second DVC 430, or both DVCs separately, may be adjusted to adjust the impedance matching ratio to a desired value. Keeping the effective capacitance of the first DVC 424 and the second DVC 430 constant allows the matching ratio between the first and second DVCs 424, 430 to be adjusted in order to adjust the impedance of the network 400 while the center frequency remains constant. Conversely, the ratio between the first DVC 424 and the second DVC 430 may remain constant while the center frequency is tuned. Both the first DVC 424 and the second DVC 430 must be changed together, proportionally, in the same direction. Moving both the first DVC 424 and the second DVC 430 up or down by the same factor at the same time moves the center frequency up or down. This keeps the ratio between the first and second DVCs 424, 430 unchanged and the matching ratio constant while tuning the center frequency.

The adjustability of the impedance matching ratio can be beneficial in several ways. Being able to adjust the impedance matching ratio allows for the optimization of the performance of the power amplifier into antenna load conditions dynamically through feedback or statically by band or by channel within bands. The performance of the power amplifier into different duplexer loads can also be optimized. Adjusting the impedance matching ratio can allow for the optimization of the performance of the power amplifier at varying power levels as needed for maximum system efficiency under a fixed Vbat value, average power tracking (APT) or envelope tracking (ET) operation. Further, the adjustability of the center frequency is also beneficial. Being able to adjust the center frequency allows for the optimization of the performance of the power amplifier for each frequency of operation. The harmonic performance by band or channel within bands is also optimized. Adjusting the center frequency enables low-loss, narrow band matching to be practical, thereby improving the efficiency of the power amplifier.

The adjustable impedance matching circuit 400 eliminates the need for fixed matching networks between power amplifiers and duplexer modules, as needed in circuit 100. The adjustable impedance matching network also eliminates the need for impedance matching tuners to compensate antenna impedance variations across bands or channels within bands or due to varying antenna use environments or load conditions. The adjustable circuit 400 further improves power amplifier efficiency by band or channel within bands by enabling the use of a low loss, narrow band matching network while at the same time enabling a wider effective operating bandwidth for the power amplifier due to the ability to tune the center frequency.

Figure 5:
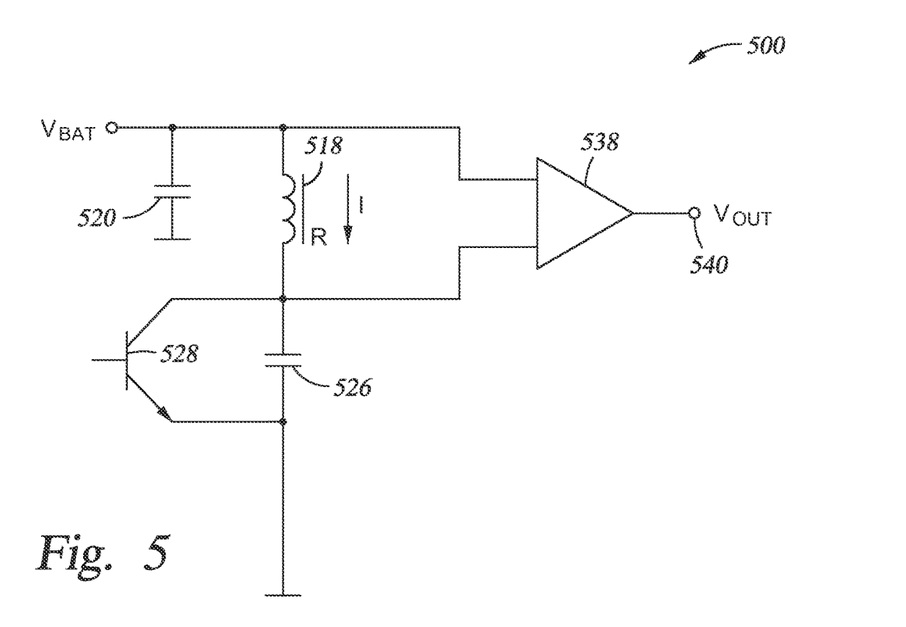
FIG. 5 is a schematic circuit diagram of a power amplifier matching circuit utilizing a power controller circuit.

FIG. 5 shows another embodiment of a power amplifier matching circuit utilizing DVCs 500, which functions as a power control circuit (PCC). The circuit 500 is coupled to the pull-in electrode 308 of the MEMS device 314. Current, or an electric signal, from a power source flows through the circuit 500 entering from the pull-in electrode 308, or Vbat. A first end of a first inductor 518 is connected with Vbat. A first end of a first capacitor 526 is connected with a second end of the first inductor 518. A transistor 528 is connected with a second end of the first capacitor 526 and the second end of the first inductor 518. A first end of an amplifier 538 is connected with the first end and the second end of the first inductor 518, and a second end of the amplifier 538 is connected with a voltage output 540. The first inductor 518 has both a resistance (R) and a current (I) across it, typically flowing from the first end to the second end of the first inductor 518. An impedance matcher and/or an aperture tuner may be coupled to the circuit 500. A first end of a second capacitor 520 may be connected with the first end of the first inductor 518, where the second end of the second capacitor 520 would be electrically grounded. The first inductor 518 may be a DC choke. The voltage output 540 may be a RF output stage. This embodiment 500 may work in conjunction with the previously described impedance matching circuit 400.

The circuit 500 is connected to a controller (not shown). The controller may be a CMOS controller. The controller is able to read the voltage across the first inductor 518. The resistance of the first inductor 518 may be known through measurement or through reference to a manufacturer data sheet. Since both the voltage and the resistance of the first inductor 518 are known, the current developed across the first inductor 518 is able to be determined or calculated. The voltage developed across the first inductor 518 is equal to the current multiplied by the resistance. Knowing the voltage across the circuit allows for the general impedance to be determined, as the general impedance is equal to the voltage divided by the current. From this equation, it can be said the impedance and the current have an inverse relationship.

The amplifier output 540 is proportional to the current flowing across the first inductor 518. The output 540 of the amplifier 538 can then be fed back to the controller. This information can then be used to adjust the impedance of the circuit 500, which in turn controls the matching impedance. Since the output 540 of the amplifier 538 is proportional to the amount of current in the circuit 500, the system can sense the amount of current the power amplifier matching circuit 500 is drawing, and can infer what the general impedance is. The system does not read the exact impedance value, but is able to give a scalar reference point. For example, the system might be able to tell if the impedance is higher or lower than 50 ohms. The system could then send a signal to the power source, the impedance matcher or aperture tuner to make the adjustments to the matching impedance. This allows for the system to determine if the impedance is too high or too low, which the system can then send a signal to make the appropriate adjustments almost immediately.

The system is able to make quick adjustments because the amplifier output 540 is constantly being fed back to the system. At any point in time, the system knows how much current is being driven through the circuit 500, and can make adjustments to the power source, the impedance matcher or aperture tuner to adjust the impedance. For example, if the current is too high, the system knows the matching impedance is too low, due to the inverse relationship between the impedance and the current, and the system can reduce the power to make the appropriate adjustment.

The current drawn by the power amplifier versus power level and supply voltage under optimum load conditions can be determined for a given power amplifier through measurements. These measurements can then be made available to a baseband processor for algorithmic determination of the correct load impedance for any supply voltage and power level. Thus, the load impedance can be varied either by the power amplifier itself or by action of the baseband to force the power amplifier current to conform to the optimum value of current for the desired operating power level and supply voltage. Further, the impedance matcher and the aperture tuner are able to tune the resonant frequency of the antenna to a particular band, and can make the antenna more efficient. One advantage of this embodiment is that the impedance matcher and the aperture tuner are able to simultaneously improve the matching impedance of the antenna while tuning the resonant frequency.

The PCC 500 used in conjunction with the previously described impedance matching circuit, or IMN, 400 makes use of the integration of the DVC matching networks and required connections to the output stage collector and Vbat supply to enable measurement of the voltage drop across the first inductor 518, which can be correlated to the current drawn by the power amplifier output stage. This allows for the current to be somewhat accurately estimated, and the information gathered from the power amplifier output stage to be used by the power amplifier itself or through feedback to a baseband processor. The PCC 500 in conjunction with the IMN 400 allows for the adjustment of the power amplifier drive power to maximize battery life under adverse conditions. The combined PCC 500 and IMN 400, herein referred to as a conjunction circuit 400/500, also allows for the adjustment of the power amplifier load impedance to optimize the power amplifier performance versus antenna load variation or duplexer impedance variation versus frequency by channel. Further, the conjunction circuit 400/500 allows for the optimization of the power amplifier load impedance at lower output power to maximize system efficiency, and allows for the optimization of the power amplifier load impedance at lower supply voltages due to APT or ET operation.

The conjunction circuit 400/500 may be used with a radio frequency front end (RFFE) system, which has both write and read back ability. The amplifier output 540 is still proportional to the current across the first inductor 518. The amplifier output 540 is then fed back to the controller system over a RFFE bus. Whenever a measurement of the voltage is made, the data gathered is put into a register. The data in the register can be read back to the system at any time, and can say how much current the conjunction circuit 400/500 is currently driving. The controller can determine if the correct amount of voltage or current is being driven through the system by reading the register. If the controller determines the amount of voltage or current is incorrect, the controller can make adjustments to correct the system. For example, if the controller determines the current is too high, the controller knows the transmit power is too high, or the matching impedance of the system is too low, and either reduces the power or increases the impedance to adjust.

Figure 6:
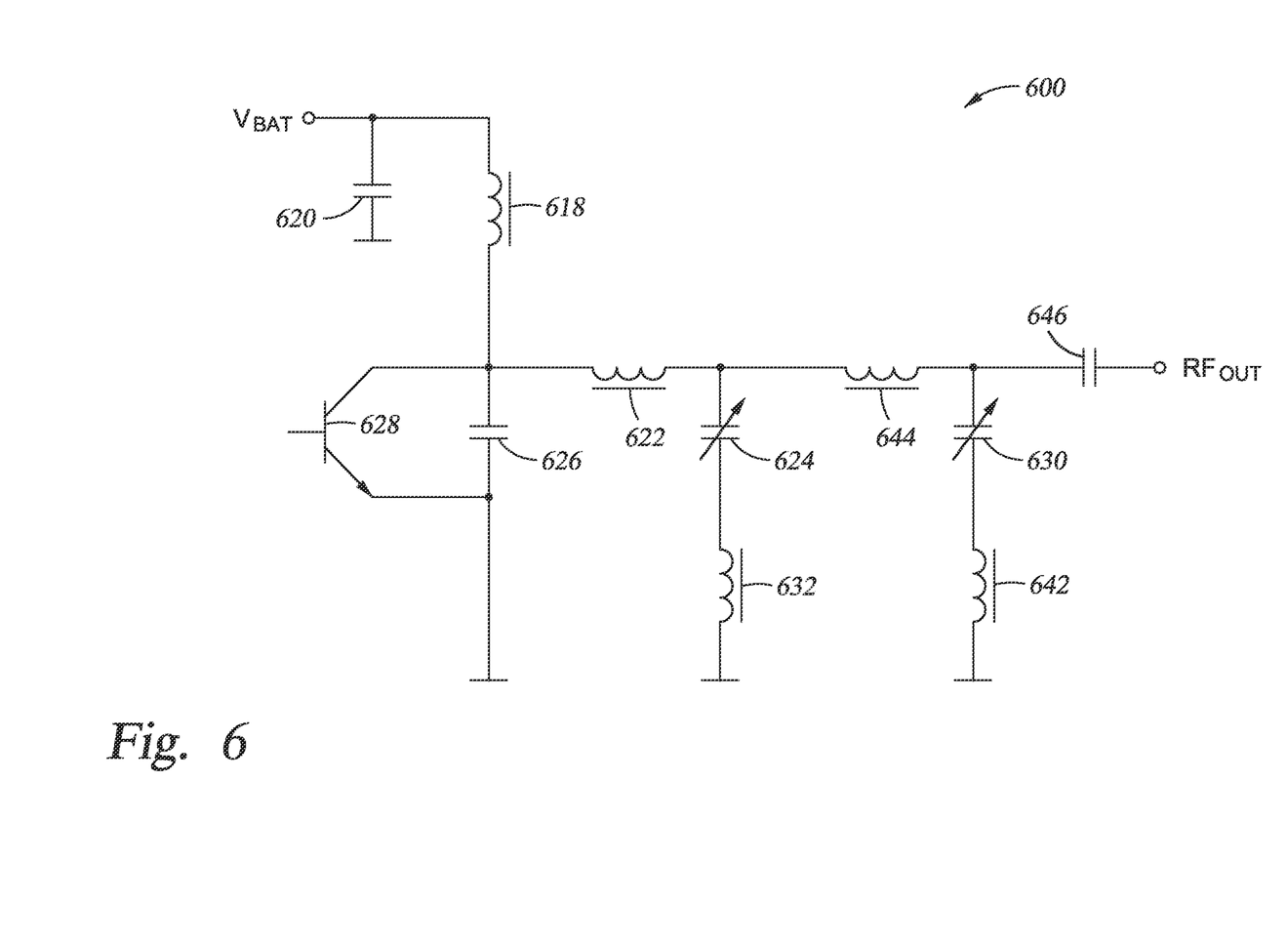
FIG. 6 is a schematic circuit diagram of a power amplifier matching circuit controlling the second and third harmonic.

FIG. 6 shows another embodiment of a power amplifier matching circuit utilizing DVCs 600. The circuit 600 is coupled to the pull-in electrode 308 of the MEMS device 314. Current, or an electric signal, from a power source flows through the circuit 600 entering from the pull-in electrode 308, or Vbat. A first end of a first inductor 618 is connected with Vbat. A first end of a first capacitor 626 is connected with a second end of the first inductor 618. A transistor 628 is connected with a second end of the first capacitor 626 and the second end of the first inductor 618. A first end of a second inductor 622 is connected with the second end of the first inductor 618. A first end of a first DVC 624 is connected with a second end of the second inductor 622. A first end of a third inductor 632 is connected with a second end of the first DVC 624. A second end of the third inductor 632 is electrically grounded. A first end of a fourth inductor 644 is connected with the second end of the second inductor 622. A first end of a second DVC 630 is connected with a second end of the fourth inductor 544. A first end of a fifth inductor 642 is connected with a second end of the second DVC 630. A second end of the fifth inductor 642 is electrically grounded. A first end of a second capacitor 646 is connected with a second end of the fourth inductor 644. A second end of the second capacitor 646 is connected with the RF output line. A first end of a third capacitor 620 may be connected with the first end of the first inductor 618, where a second end of the third capacitor 620 would be electrically grounded. The second capacitor 626 may also be a DVC, similar to DVC 624 or 630. The first inductor 618 may be a DC choke, and the third capacitor 646 may be a DC block.

The circuit 600 differs from the impedance matching network 400 and the power control circuit 500 discussed above in that the circuit 600 has a third harmonic trap in addition to a second harmonic trap, allowing only the first harmonic to be transmitted out to the antenna. The second harmonic and the third harmonic get reflected back into the power amplifier matching circuit by a second harmonic trap and a third harmonic trap, respectfully. The first DVC 624 and the third inductor 632 create a series resonant around the second harmonic. The second DVC 630 and the fourth inductor 642 create a series resonance around the third harmonic. The first inductor 618, the second inductor 622 and the second capacitor 626 create a parallel resonant around the second harmonic. The third inductor 632 and the fourth inductor 642 may be integrated into the substrate, which further allows for harmonic control, as the value of the third inductor 632 and the fourth inductor 642 may be varied. This allows for the harmonic frequency of both the first DVC 624/third inductor 630 trap and the second DVC 630/fourth inductor 642 trap to be varied. The circuit 600 also allows for the variability of impedance matching ratios and the center frequency by varying the capacitance of the first and second DVCs 624, 630, in a similar manner as the impedance matching network 400 discussed above.

Overall, the power amplifier matching circuits with DVCs discussed above are successful at controlling undesired harmonics and matching impedances.

While the foregoing is directed to embodiments of the present invention, other and further embodiments of the invention may be devised without departing from the basic scope thereof, and the scope thereof is determined by the claims that follow.

The invention claimed is:

1. A power amplifier matching circuit, comprising:
   a first end of a first inductor electrically coupled with a power source;
   a first end of a first capacitor connected with a second end of the first inductor;
   a transistor connected with a second end of the first capacitor and the second end of the first inductor;
   a first end of a second inductor connected with the second end of the first inductor;
   a first end of a first digital variable capacitor connected with the second end of the second inductor;
   a first end of a second digital variable capacitor connected with the second end of the second inductor;
   a first end of a third inductor connected with a second end of the second digital variable capacitor;
   a second end of the third inductor electrically grounded;
   a second end of the first digital variable capacitor connected with a first end of a fourth inductor; and
   a second end of the fourth inductor is electrically grounded, wherein the second end of the first digital variable capacitor and the first end of the fourth inductor are connected with a RF output.

2. The power amplifier matching circuit of claim 1, wherein the first digital variable capacitor, the second digital variable capacitor and the fourth inductor function as a capacitor transformer.

3. The power amplifier matching circuit of claim 1, wherein the first inductor is a DC choke.

4. The power amplifier matching circuit of claim 1, wherein an impedance matching ratio is adapted to be varied while a center frequency remains constant.

5. The power amplifier matching circuit of claim 1, wherein the center frequency is adapted to be tuned while the impedance matching ratio is constant.

6. The power amplifier matching circuit of claim 1, wherein the second digital variable capacitor and the third inductor are adapted to create a series resonance around the second harmonic.

7. The power amplifier matching circuit of claim 1, wherein the second capacitor, the first inductor and the second inductor are adapted to create a parallel resonance around the second harmonic.

8. The power amplifier matching circuit of claim 1, wherein a first end of a second capacitor is connected with the first end of the first inductor, and wherein the second end of the second capacitor is electrically grounded.

9. A power amplifier matching circuit, comprising:
   a first end of a first inductor electrically coupled with a power source;
   a first end of a first capacitor connected with a second end of the first inductor;
   a transistor connected with a second end of the first capacitor and the second end of the first inductor;
   a first end of an amplifier connected with the first end and the second end of the first inductor, wherein a second end of the amplifier is connected with a voltage output, and wherein an output of the amplifier is proportional to a current flowing from the first end of the first inductor to the second end of the first inductor; and
   a first end of a second capacitor connected in series with the first end of the first inductor, wherein the second end of the second capacitor is electrically grounded.

10. A power amplifier matching circuit, comprising:
    a first end of a first inductor electrically coupled with a power source;
    a first end of a first capacitor connected with a second end of the first inductor;
    a transistor connected with a second end of the first capacitor and the second end of the first inductor; and
    a first end of an amplifier connected with the first end and the second end of the first inductor, wherein a second end of the amplifier is connected with a voltage output, and wherein an output of the amplifier is proportional to a current flowing from the first end of the first inductor to the second end of the first inductor, wherein a radio frequency front end bus is adapted to relay information to a controller system.

11. A power amplifier matching circuit, comprising:
    a first end of a first inductor electrically coupled with a power source;
    a first end of a first capacitor connected with a second end of the first inductor;
    a transistor connected with a second end of the first capacitor and the second end of the first inductor; and
    a first end of an amplifier connected with the first end and the second end of the first inductor, wherein a second end of the amplifier is connected with a voltage output, and wherein an output of the amplifier is proportional to a current flowing from the first end of the first inductor to the second end of the first inductor, wherein a first end of a second capacitor is connected with the first end of the first inductor, and wherein the second end of the second capacitor is electrically grounded.

12. The power amplifier matching circuit of claim 11, wherein the first inductor is a DC choke.

13. The power amplifier matching circuit of claim 11, wherein the output of the amplifier is adapted to adjust the matching impedance.

14. The power amplifier matching circuit of claim 11, wherein the output of the amplifier is adapted to adjust the power of the circuit.

15. A power amplifier matching circuit, comprising:
    a first end of a first inductor electrically coupled with a power source;
    a first end of a first capacitor connected with a second end of the first inductor;
    a transistor connected with a second end of the first capacitor and the second end of the first inductor;
    a first end of a second inductor connected with the second end of the first inductor;
    a first end of a first digital variable capacitor connected with a second end of the second inductor;
    a first end of a third inductor connected with a second end of the first digital variable capacitor;
    a second end of the third inductor electrically grounded;

a first end of a fourth inductor connected with the second end of the second inductor;
a first end of a second digital variable capacitor connected with a second end of the fourth inductor;
a first end of a fifth inductor connected with a second end of the second digital variable capacitor;
a second end of the fifth inductor electrically grounded;
a first end of a second capacitor connected with a second end of the fourth inductor; and
a second end of the second capacitor connected with a RF output.

16. The power amplifier matching circuit of claim 15, wherein the first digital variable capacitor and the fourth inductor are adapted to create a series resonance around the second harmonic.

17. The power amplifier matching circuit of claim 15, wherein the second digital variable capacitor and the fifth inductor are adapted to create a series resonance around the third harmonic.

18. The power amplifier matching circuit of claim 15, wherein first inductor, the second inductor and the second capacitor are adapted to create a parallel resonance around the second harmonic.

19. The power amplifier matching circuit of claim 15, wherein the first inductor is a DC choke and the third capacitor is a DC block.

20. The power amplifier matching circuit of claim 15, wherein a first end of a third capacitor is connected with the first end of the first inductor, and wherein the second end of the third capacitor is electrically grounded.

* * * * *